United States Patent
Hogeboom et al.

(10) Patent No.: US 9,405,511 B2
(45) Date of Patent: Aug. 2, 2016

(54) S12 TX FIR ARCHITECTURE

(71) Applicants: STMICROELECTRONICS (CANADA), INC., Ottawa (CA); STMICROELECTRONICS S.r.l., Agrate Brianza (IT)

(72) Inventors: John Hogeboom, Ottawa (CA); Hock Khor, Ottawa (CA); Matteo Alessio Traldi, Milan (IT); Anton Pelteshki, Carleton Place (CA)

(73) Assignees: STMICROELECTRONICS (CANADA) INC., Ottawa, Ontario (CA); STMICROELECTRONICS S.R.L., Agrate Brianza (MB) (IT)

(*) Notice: Subject to any disclaimer, the term of this patent is extended or adjusted under 35 U.S.C. 154(b) by 122 days.

(21) Appl. No.: 14/524,774

(22) Filed: Oct. 27, 2014

(65) Prior Publication Data

US 2015/0074160 A1  Mar. 12, 2015

Related U.S. Application Data

(62) Division of application No. 13/335,624, filed on Dec. 22, 2011, now Pat. No. 8,886,694.

(60) Provisional application No. 61/427,625, filed on Dec. 28, 2010.

(51) Int. Cl.
| | | |
|---|---|---|
| H03H 7/06 | (2006.01) | |
| G06F 7/72 | (2006.01) | |
| H03H 17/06 | (2006.01) | |
| G06F 5/16 | (2006.01) | |
| H04L 25/02 | (2006.01) | |

(52) U.S. Cl.
CPC ...... *G06F 7/724* (2013.01); *G06F 5/16* (2013.01); *H03H 17/06* (2013.01); *H04L 25/0288* (2013.01); *H04L 25/0272* (2013.01)

(58) Field of Classification Search
CPC .............................. H03H 17/06; H03H 15/00
See application file for complete search history.

(56) References Cited

U.S. PATENT DOCUMENTS

| | | |
|---|---|---|
| 8,705,602 B1 | 4/2014 | Ding et al. |
| 2005/0089086 A1 | 4/2005 | Hwang et al. |
| 2006/0274817 A1 | 12/2006 | Lakkis |
| 2007/0071083 A1* | 3/2007 | Canagasaby ........ H04L 25/0276 375/229 |
| 2007/0121716 A1 | 5/2007 | Nagarajan et al. |
| 2007/0147559 A1* | 6/2007 | Lapointe ............ H03H 17/0223 375/350 |

* cited by examiner

*Primary Examiner* — Chuong D Ngo

(74) *Attorney, Agent, or Firm* — Allen, Dyer, Doppelt, Milbrath & Gilchrist, P.A.

(57) ABSTRACT

A FIR transmit architecture uses multiple driver divisions to allow signals with different delays to be summed into the output signal by the driver itself. The architecture includes a first multiplexer, a plurality of delay cells, a plurality of sign blocks, a switch block, a second multiplexer, and a plurality of drivers.

25 Claims, 8 Drawing Sheets

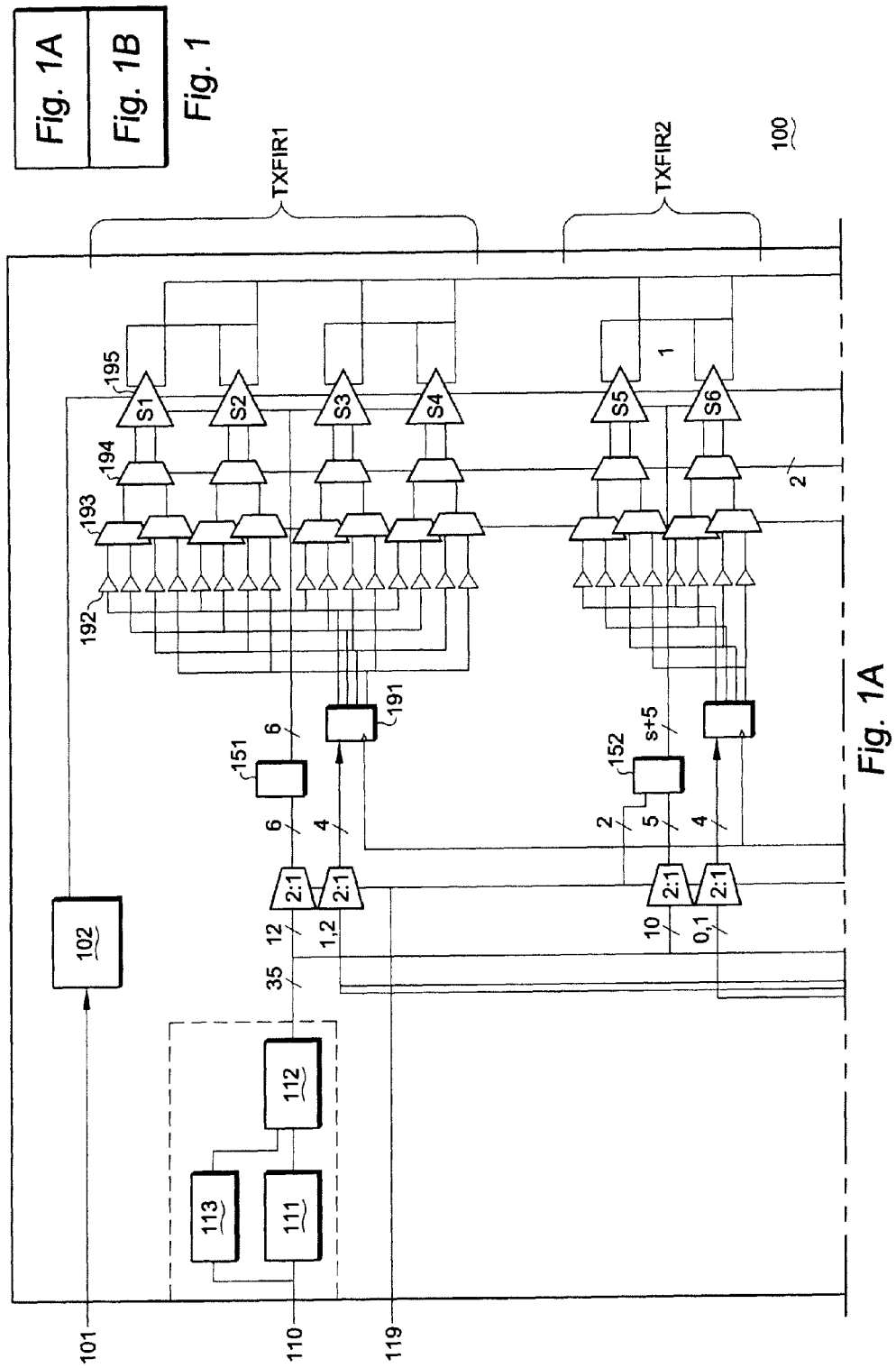

S12 TX FIR ARCHITECTURE

FIELD OF THE INVENTION

This invention generally relates to finite impulse response (FIR) filter, and in particular to improvements to a transmitter (TX) FIR architecture with multiple driver divisions.

BACKGROUND OF THE INVENTION

A FIR (finite impulse response) equalization filter is intended to pre-distort a signal to be transmitted over some length of transmission media in a manner which compensates or equalizes the majority of the distortion caused by losses, dispersions, and reflections in that media. The transmission media typically includes PCB traces, connectors, cables, or optical fiber and its electro-optic interfaces. At low frequencies, the media loss per unit length is normally low and increases smoothly, at first largely due to skin effect which increases as the square-root of frequency, then into the GHz range dielectric losses become dominant with loss increasing directly with frequency. When optical media is involved the general character will be similar for short to medium lengths, but long-range media may require much more complex equalization.

SUMMARY OF THE INVENTION

The invention is directed to improvements to a TX FIR architecture with multiple driver divisions.

According to an aspect of an embodiment of the invention, a TX FIR architecture comprises a mux, a plurality of delay cells coupled to the mux, a plurality of sign operators coupled to the delay cells, a plurality of serializer muxes each coupled to each sign operator, and a plurality of driver groups each coupled to each serializer mux. According to another aspect of an embodiment of the invention, each driver group comprises one or more drivers, wherein each driver comprises a plurality of binary-weighted differential pairs, wherein each driver group and each driver can be manipulated on and off.

According to an aspect of an embodiment of the invention, a TX FIR architecture comprises a mux coupled to a parallel input data, a delay block coupled to the mux, a control bus comprising a coefficient register comprising a plurality of FIR coefficients, a register comprising bits for selecting delays and FIR coefficients, and a plurality of driver groups coupled to the control bus, the delay block, and the register. According to another aspect of an embodiment of the invention, the driver group comprises a first mux coupled to the control bus and the register configured to select a FIR coefficient for a delay tap from a list of defined delay taps for the driver group and a second mux coupled to the delay block and the register configured to select a delayed signal for the delay tap.

According to an aspect of an embodiment of the invention, a method of driving a TX FIR architecture output comprises calculating a plurality of delayed data for each delayed taps of an input data, selecting a delayed data for each driver group of a plurality of driver groups, feeding the delayed data to one or more drivers in the driver group, driving a cursor waveform for each driver based on the delayed data and a FIR coefficient for the corresponding delay tap, and summing the cursor waveforms.

The foregoing and other features, utilities and advantages of the invention will be apparent from the following more particular description of an embodiment of the invention as illustrated in the accompanying drawings.

DETAILED DESCRIPTION

Figure 1B:
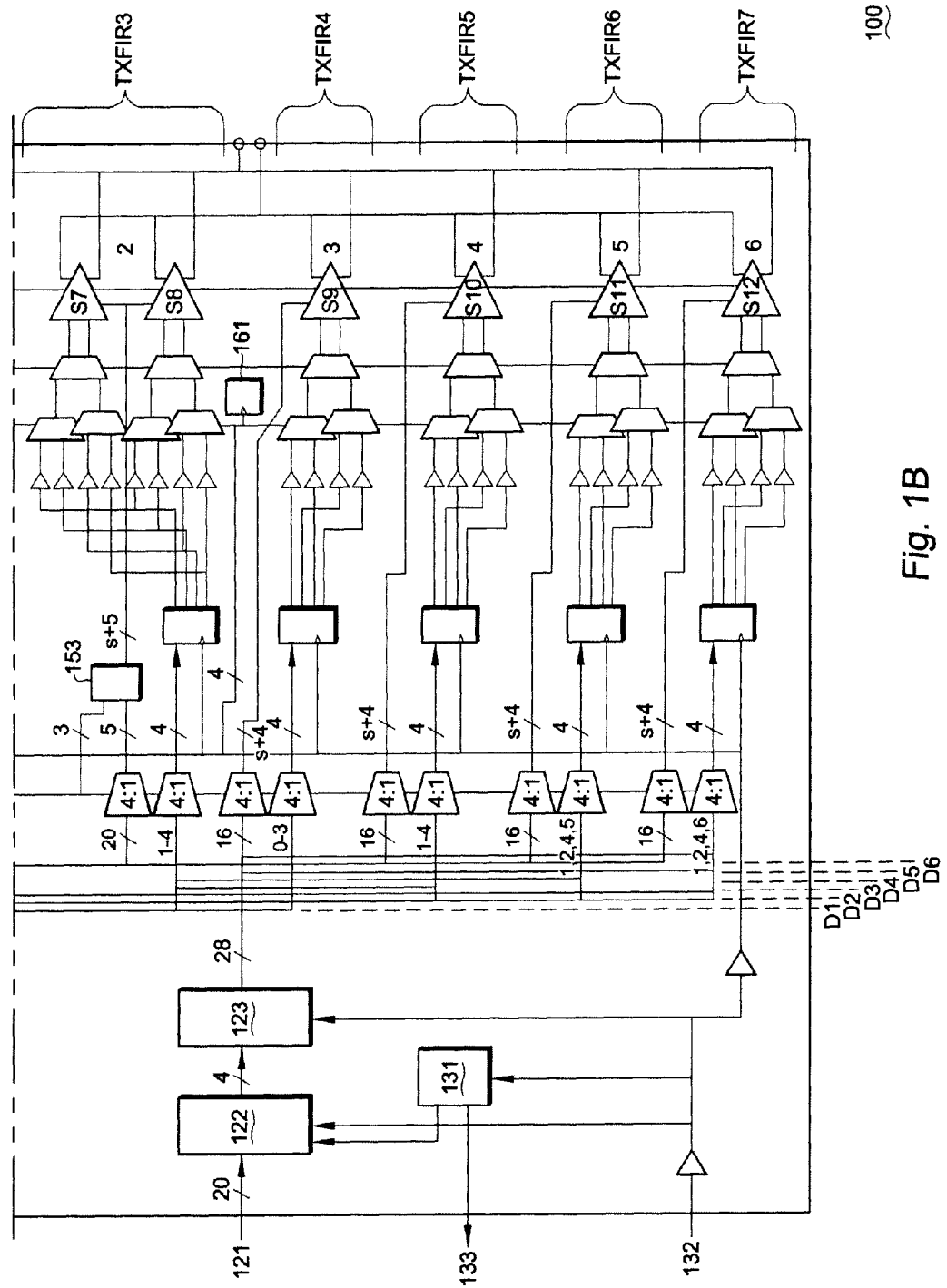
FIG. 1 illustrates a TX FIR architecture according to an embodiment of the invention.

Embodiments of the present invention are hereafter described in detail with reference to the accompanying figures and are provided for purposes of illustration only and not for the purpose of limiting the invention as defined by the appended claims and their equivalents. Descriptions of well-known functions and constructions are omitted for clarity and conciseness. The figures are meant to illustrate features of exemplary embodiments of the invention and are not drawn to scale.

A detailed description of the present invention follows, utilizing the accompanying drawings as referenced by the Figures. The preferred embodiments are referenced as each figure is addressed.

A FIR equalizer typically includes delay elements to delay the undistorted signal, and gain elements to apply and sum each delayed signal component with a specific weighting. Weighting versus delay is configured to cancel the dispersion of the original pulse into nearby bit periods; therefore, the delays usually have increments of one bit period. After passing through the transmission media, the resulting compensated signal will produce a waveform close to the original over time intervals of the bit period and above, but will be smoothed by the media to show sinusoidal-like transitions between bits of differing polarity and nearly constant amplitude between bits of the same polarity. Because all signal components used for correction are derived directly from the original signal, this type of "Feed-Forward" equalizer is not affected by interference or cross-talk generated in the transmission media.

The number of delays needed in the sum is modest since most of the distortion occurs at high frequencies, and since only one sample is needed per data bit to recover the data; i.e., the delays need only intervals of one bit-time or one Unit-Interval (UI) and need only span the number of bits corresponding to significant pulse dispersion. While most of the signal spreading in transmission media occurs toward the following bits, i.e., residual energy called post-cursor components, some of the signal energy may travel faster than the median of each bit pulse (called the cursor) and arrive one or even two UI before the median energy peak, creating interference called pre-cursors. With a FIR equalizer, such pre-cursors are just as easily corrected as are post-cursors, whereas other forms of equalization, such as decision feedback equalizer (DFE), using feedback cannot correct for pre-cursor intersymbol interference (ISI).

The weighting and summing elements of a FIR equalizer can be subdivisions of a current-mode differential driver which is split into multiple segments that are grouped such that there is one segment per delay. The segment current can be switched by the data bit-stream and can be varied to perform the weighting function. Because of the current mode (high impedance), several characteristics of such segments can simply be connected in parallel to perform the summing function of the FIR equalizer. It is beneficial to use the relatively large final output driver of the SerDes transmitter for this multi-segment function because its size means that it must typically already be built from several parallel elements, and it must be a current mode structure so that parallel load resistors can provide the accurate linear output termination for signal integrity when connected to transmission media.

If assignment of segments to each delay was the only method used for equalizer programming, a large number of small segments would be needed, significantly increasing layout complexity, area, fringing capacitance, and power while degrading performance. On the other hand, if variable amplitude for each segment was the only method used, each would need to be capable of providing the maximum drive ever expected for that delay component, making the total size of the driver much larger than needed in any particular application, again with the same effect in terms of area and performance. What is needed for flexibility, high utilization, and near optimum performance for all expected settings, is modest reassignment capability of individual segments plus modest amplitude variability for each.

FIG. 1 illustrates a TX FIR architecture according to an embodiment of the invention.

In the exemplary FIR equalizer shown and described in the diagram and text below, there are 12 identical segments (S1-S12) with four of them (S1-S4) combined as one group (TXFIR1), another four (S5-S8) combined into two groups of two segments each (TXFIR2-TXFIR3), and the remaining four (S9-S12) all independent, for a total of seven groups (TXFIR4-TXFIR7) able to implement a cursor plus up to six taps. The group of four (TXFIR1), and one group of two (TXFIR2) can be switched or assigned to just two different delays, while the other five can be assigned to different sets of four different delays. This segment assignment defines both which FIR coefficients are implemented and the coarse amplitude setting for each. Each segment has 16 different, equally spaced amplitude settings from zero to 15, allowing fine tap coefficients in steps of about one percent of the total.

To achieve simple programming of a wide range of FIR equalizers, first each of the seven groups of segments (TXFIR1-TXFIR7) is set to a delay of zero to six, then an amplitude directly associated with each delay is set and applies to all segments that have selected that delay. Two of the coefficients (TXFIRC1 and TXFIRC2), have six-bit resolution because the four segment cursor (TXFIR1) requires at least six bits to control its 60 sub-segments, and because the cursor can select either delay one or two to allow use of either one or two pre-cursor coefficients. Three coefficients (TXFIRC0 and TXFIRC3-TXFIRC4) have five-bit resolution because at least one of the double segments (TXFIR2 and TXFIR3), which require five bits, can select the delay corresponding to that coefficient. Two (TXFIRC5-TXFIRC6) need only four-bit resolution because only single segments (TXFIR4-TXFIR7) can select their associated delay. TXFIRC0-TXFIRC6 are accessible from 35-bit register 112.

When coefficients have more bits than needed by any segment that selects that corresponding delay, the bits of lower significance are not used. For example, if segment six (S6), which is part of a double segment (TXFIR2), is part of the cursor, which has six-bit resolution, it uses only cursor coefficient bits [5:2].

In one aspect of an embodiment of the invention, sequential "add one" elements 151, 152, and 153 are included in the paths of the larger coefficients to smooth out their steps in drive amplitude as the coefficient setting is varied. The addition of these elements prevents single segments from all incrementing simultaneously when the upper four most significant coefficient bits change. In other words, the adders offset the settings where the four most significant bits change state differently for each of the four single segments to allow the segments to change in a staggered fashion between different settings as the six-bit coefficient varies. For adder 151 coupled to TXFIR1, if coefficient is greater than 31, add three limited to 63. For adders 152 and 153 coupled to TXFIR2 and TXFIR3, respectively, if coefficient is greater than 15, add one limited to 31. Adder 152 also adds one if it is the cursor coefficient and its LSB is '1'. According to one aspect of an embodiment of the invention, each group of segments (TXFIR1-TXFIR7) comprises a latch 191, a plurality of buffers 192, serializer muxes 193 and 194, and driver 195. Latch 191 takes as input a four-bit cursor from a desired tap for the group. Each of the bits are fed reproduced as separate inputs for each segment of the group at buffers 192. While latch 191 is conceptually illustrated as one latch, the number can be comparable to the number of drivers in a group. For example, for TXFIR1, there are four driver groups (S1-S4); as such, there can be four latches, with each serving one driver group. Two serializer muxes 193 for each segment selects two of four bits to forward at an up cycle of clock 132 and the other two bits at a down cycle of clock 132. Half rate clock 161 provides a clock signal at the middle of the up and down cycle of clock 132 to mux 194 to send the selected two bits to driver 195 to sum the bits. Latch 191 serves as a retimer for allowing better setup and hold margins for mux 193. The driver 195 is driven by a driver bias 102 according to an input DRVLEV[2:0] 101.

The group of four segments (TXFIR1) always defines the cursor, but all of the other groups can select the same delay to allow cursor size to be varied up to 100% in 8.33% increments. In all cases the total drive setting used for the cursor must exceed 50% of the total drive, otherwise the effective cursor signal component drops to zero or negative because, in function, the cursor value is the total drive amplitude of all segments selecting the cursor delay, minus the drive level of all others. This is because the taps all switch at different times than the cursor so sometimes add to the cursor and other times subtract, but the actual cursor is the component that is not dependent on the other data delays. For the same reason, each of the other FIR coefficients is double the relative drive level of all segments that select that coefficient. Some segments groups, in particular the cursor group of four segments and one of the groups of two segments, can only select two different tap delays, while all of the remaining give groups can each select four different tap delays. Which four of the available seven delays can be chosen by each of these varies in an attempt to provide the largest number of practical choices within the limit of four choices for each (set by the benefit of limiting the selectors to two stages of matched 2:1 mux elements).

The output driver 195 and the last two 2:1 stages of the serializer mux 194 are split into 12 identical segments which are organized into seven divisions which can each independently select source signals delayed by zero to six UI and vary their drive current to achieve many FIR equalizer configurations with amplitude coefficient increments of <2%, (<1% in current). Four of the segments are permanently grouped (division TXFIR1) as a main portion of the cursor tap and can be driven via delays of one or two UI. Two more are permanently grouped (division TXFIR2) for use as the first pre-cursor tap or as part of the cursor tap, so it can select delays of zero or one. A further two (division TXFIR3) are permanently grouped for more general post-cursor use and can select delays of one to four. All of these three divisions totaling eight segments can only compensate for +ve ISI, so have no polarity control bit, but internally polarity does reverse whenever they act as taps different from the cursor. Individual segments TXFIR4 to TXFIR7 can pick tap delays of (0, 1, 2, 3), (1, 2, 3, 4), (1, 2, 4, 5), (1, 2, 4, 6), respectively, and each has a separate polarity control bit.

Coefficient values listed are twice the percentage weighting of their tap drive currents because the tap current either opposes or supports the cursor amplitude, thereby doubling its effect. The drive currents of all segments outputting the signal from delays zero to six UI are selected by thirty-five internal control bits 112, organized into seven corresponding binary coded amplitude coefficients, TXFIRC0 to TXFIRC6. These seven amplitude coefficients are selected by a mux that parallels the delay selections for the same division and that are selected by the same control register TXFIRA 119. Hence, all segments selecting a given delay use the amplitude coefficient with the same number as their tap delay. Furthermore, the amplitude coefficients are MSB justified with the amplitude coefficient inputs they drive in each division.

For the six-bit amplitude control bits to the four-segment division zero, the five LSBs control 31 sub-segments while the MSB controls only 29 of the available 60. Hence, the value is limited to 60, and three is added if the MSB='1'. Similarly, for the two five-bit amplitude inputs, the MSB drives only 15 rather than 16 sub-segments, so the input value is limited to 30, and one is added if the MSB='1'.

Also, '1' is added to the six-bit coefficients between each of the single segment divisions to reduce cursor granularity. Adder 171 adds '1' to TXFIRC1, TXFIRC2, and TXFIRC3 unless maxed. Adder 172 adds '1' to TXFIRC1, TXFIRC2, and TXFIRC4 unless maxed. Adder 173 adds '1' to TXFIRC1 and TXFIRC2 unless maxed.

The 35 amplitude coefficient bits are accessed such that from the control bus they appear as one virtual 16-bit register 111, TXFIRB, which utilizes its two MSB Write_Data inputs to supply an address to select one of four 14-bit sub-registers rather than to supply register data (if BE MSB='0', stored b15 & b14 are used). The first of those four sub-registers is TXFIRB0 (7×2 bits), which is not an independent register, rather, is used to hold, decrement, increment, or reset each of the seven amplitude coefficients TXFIRC0 to TXFIRC6 in one command to minimize bandwidth for remotely directed adaptation. The same command also returns two bits per coefficient indicating saturation and high or low magnitude to inform the controller to stop further adjustment in that direction, etc. The remaining three sub-registers provide direct access to the 35 bits of the above seven coefficients which are grouped to fit within the 14 bits or less of the three registers, TXFIRB1=(TXFIRC0[5], TXFIRC1[6]), TXFIRB2=(TXFIRC2[6],TXFIRC3[5]), and TXFIRB3=(TXFIRC4[5],TXFIRC5[4],TXFIRC6[4]).

The four MSBs of each amplitude coefficient roughly select zero to 15 sub-segments for each segment it controls, where each sub-segment is an elemental cascode current limiting device biased to limit at $6\frac{2}{3}*(16+DRVLEV[2:0])=133\frac{1}{3}$ uA nominally (DRVLEV[2:0]='4'). With 15 sub-segments of all 12 segments enabled, the total current is nominally 15*12*133⅓=24 mA, but in practice several segments will be programmed for less current to implement the required specific FIR coefficients, so 20 mA is the intended practical maximum. The sub-segment 6⅔ uA reference current factor in the above equation is regulated by the external 511 ohm reference resistor.

Assignment of sign bits and segment groups (divisions) one to seven (TXFIR1-TXFIR7) to FIR coefficients are made strictly by register FIR_A 119. FIR_C coefficients (TXFIRC0-TXFIRC6), 35 bits in seven real registers accessed via the virtual FIR_B register, assign the corresponding amplitudes to any segment selecting that coefficient. FIR coefficients are also weighted by the number of driver segments selected for each. When a segment group has fewer control bits than the coefficient, it uses only the MSBs, leaving unused LSBs. For example, if segment six (S6) is part of the cursor, it uses only cursor coefficient bits [5:2]. However, in this particular case, to improve granularity, the "add one" block 152 may change these bits from the original FIR_C coefficients. For the two and four segment groups (TXFIR1-TXFIR3), full range is binary 30 and 60, respectively, and these limits are substituted if higher values are applied. The adder/limiter block (151, 152, 153) in these sections does this substitution and also compensates for segments having 15 sub-segments rather than 16.

Further regarding FIR_A[15:0], for TXFIR1 and TXFIR2, one bit is used to select the delay. For TXFIR3, two bits are used to select the delay. For TXFIR2 and TXFIR3, the sign of +ve is needed only if the selection is the same as TXFIR1. For TXFIR4-TXFIR7, two bits are used to selection one of four delays, and one bit is used to select sign.

Divider 133 derives the word clock from clock signal 131. The word clock will make its way to the digital block to synchronize the proper delivery of the parallel input data from the digital to the analog, i.e., mux 122.

Figure 2:
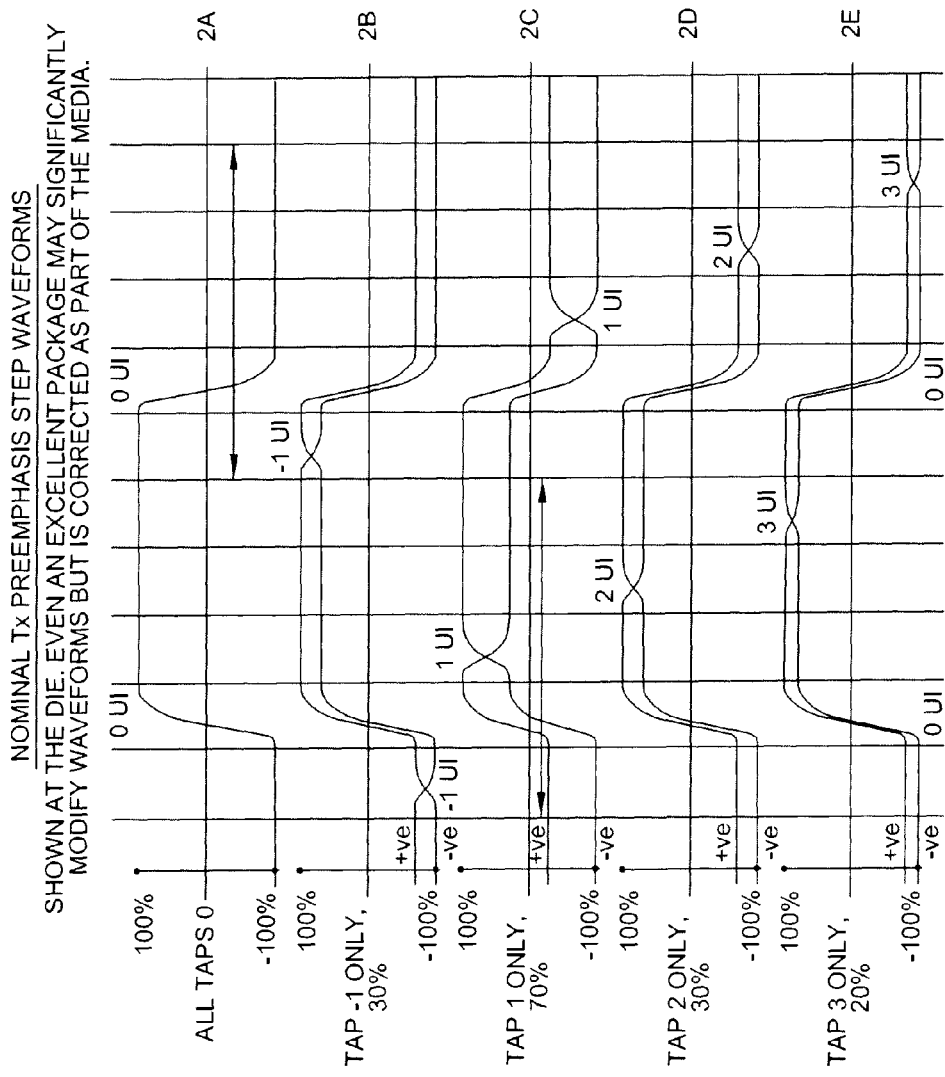
FIG. 2 illustrates nominal TX preemphasis step waveforms of a TX FIR architecture according to an embodiment of the invention.

FIG. 2 illustrates nominal TX preemphasis step waveforms of a TX FIR architecture according to an embodiment of the invention.

For all waveforms, the FIGS. 2A-2E illustrate the values of +ve and -ve at various taps and driven with various values. FIG. 2A illustrate the waveforms when all taps are '0'. FIG. 2B illustrates the waveforms at tap '-1' driven at 30%. FIG. 2C illustrates the waveforms at tap '1' driven at 70%. FIG. 2D illustrates the waveforms at tap '2' driven at 30%. FIG. 2E illustrates the waveforms at tap '3' driven at 20%.

Referring to the waveforms, it is noted that using +ve coefficients for any given tap reduces the D.C. amplitude while at the same time maximizing transition amplitude within the peak amplitude limits. Negative coefficients maintain maximum D.C. amplitude but reduce the transition slope and amplitude.

It is further noted that the waveforms are shown at die. Even an excellent package may significantly modify waveforms but is corrected as part of the media.

FIG. 3 illustrates customized pre- and post-cursors waveforms of a TX FIR architecture according to an embodiment of the invention.

Figure 3A:
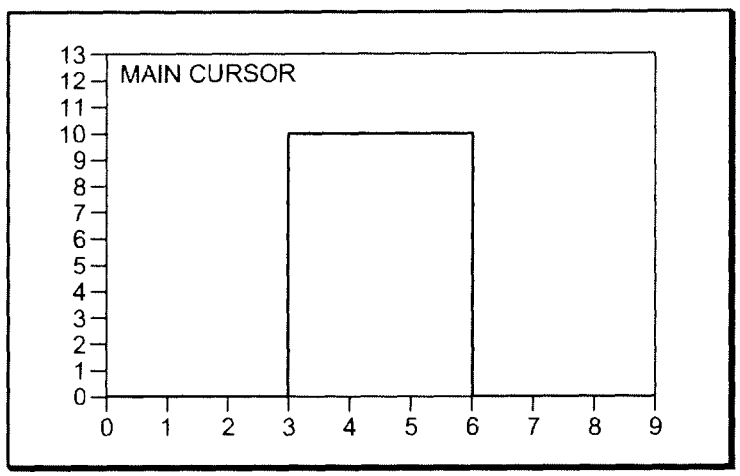
FIGS. 3A-3C illustrate customized pre- and post-cursors waveforms of a TX FIR architecture according to an embodiment of the invention.
Figure 3A:
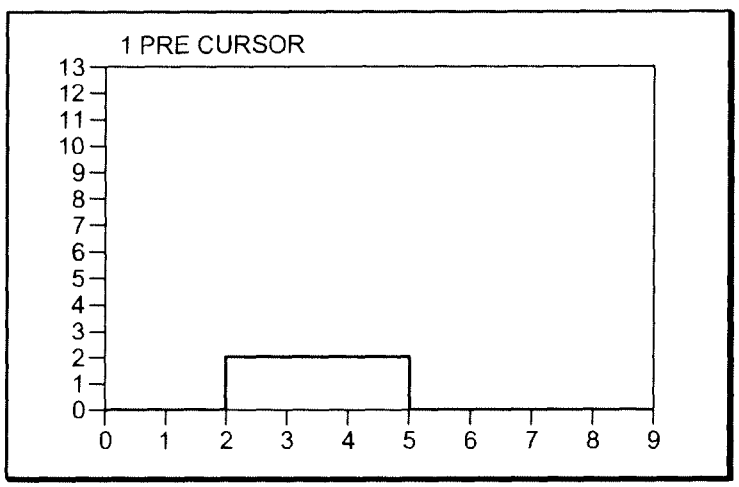
Figure 3A:
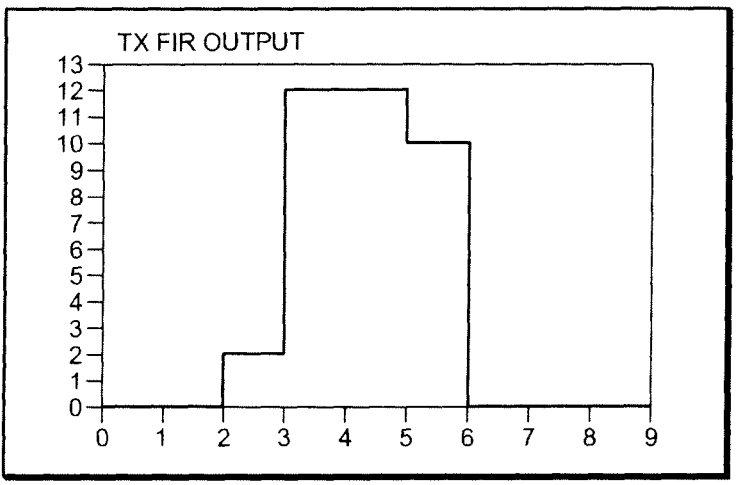
Figure 3B:
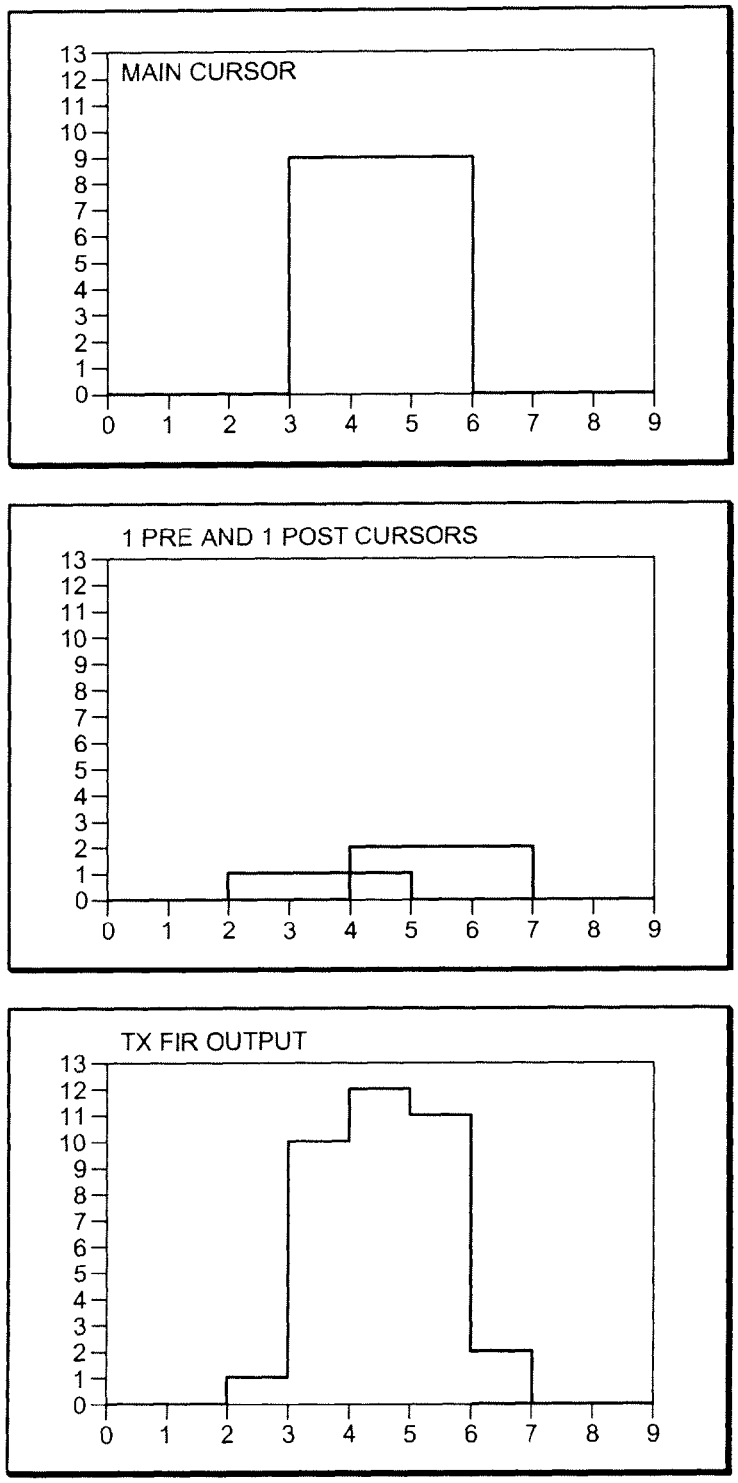
Figure 3C:
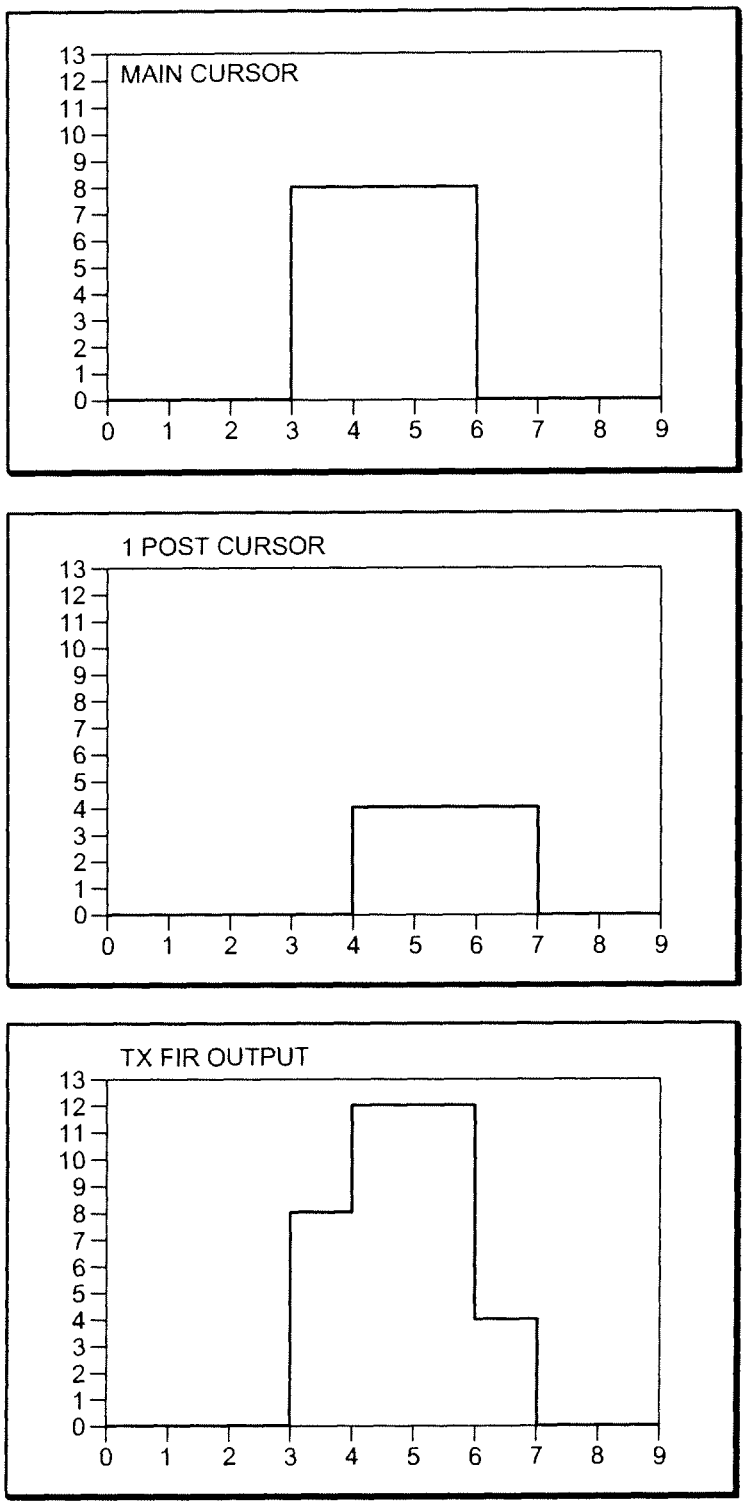

FIG. 3A illustrates the TX FIR output when the main cursor is added with one pre-cursor. FIG. 3B illustrates the TX FIR output when main cursor is added with one pre- and one post-cursor. FIG. 3C illustrates the TX FIR output when the main cursor added with one post-cursor.

Figure 4:
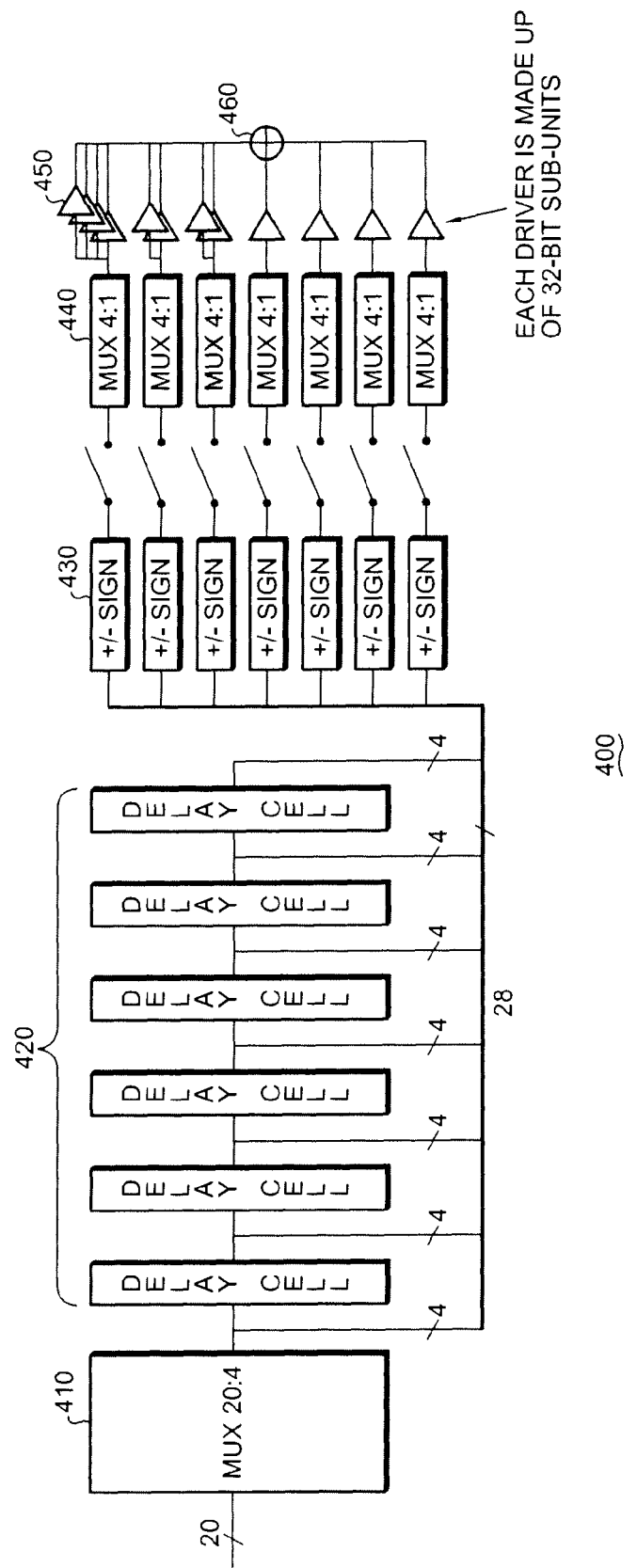
FIG. 4 illustrates a block diagram of a TX FIR architecture according to an embodiment of the invention.

FIG. 4 illustrates a block diagram of a TX FIR architecture 400 according to an embodiment of the invention.

TX FIR architecture 400 comprises mux 410, delay cells 420, sign operator 430, serializer muxes 440, and drivers 450. With the original signal from multiplexer 410 from a parallel input data, the delay cells 420 create delayed versions of the original signal and provide the basis for TX FIR at the summing point 460.

According to an aspect of an embodiment of the invention, each multiplexer 440 can select either the original signal or its delayed versions. This allows the FIR the flexibility to vary the number of pre- and post-cursors without circuit layout modifications. According to another aspect of an embodiment of the invention, the amplitude resolution of the pre- and post-cursors can be further refined by turning ON and OFF each individual driver 450 (and/or its sub-units). Preferably, each driver 450 is made up of 32 sub-units.

Figure 5:
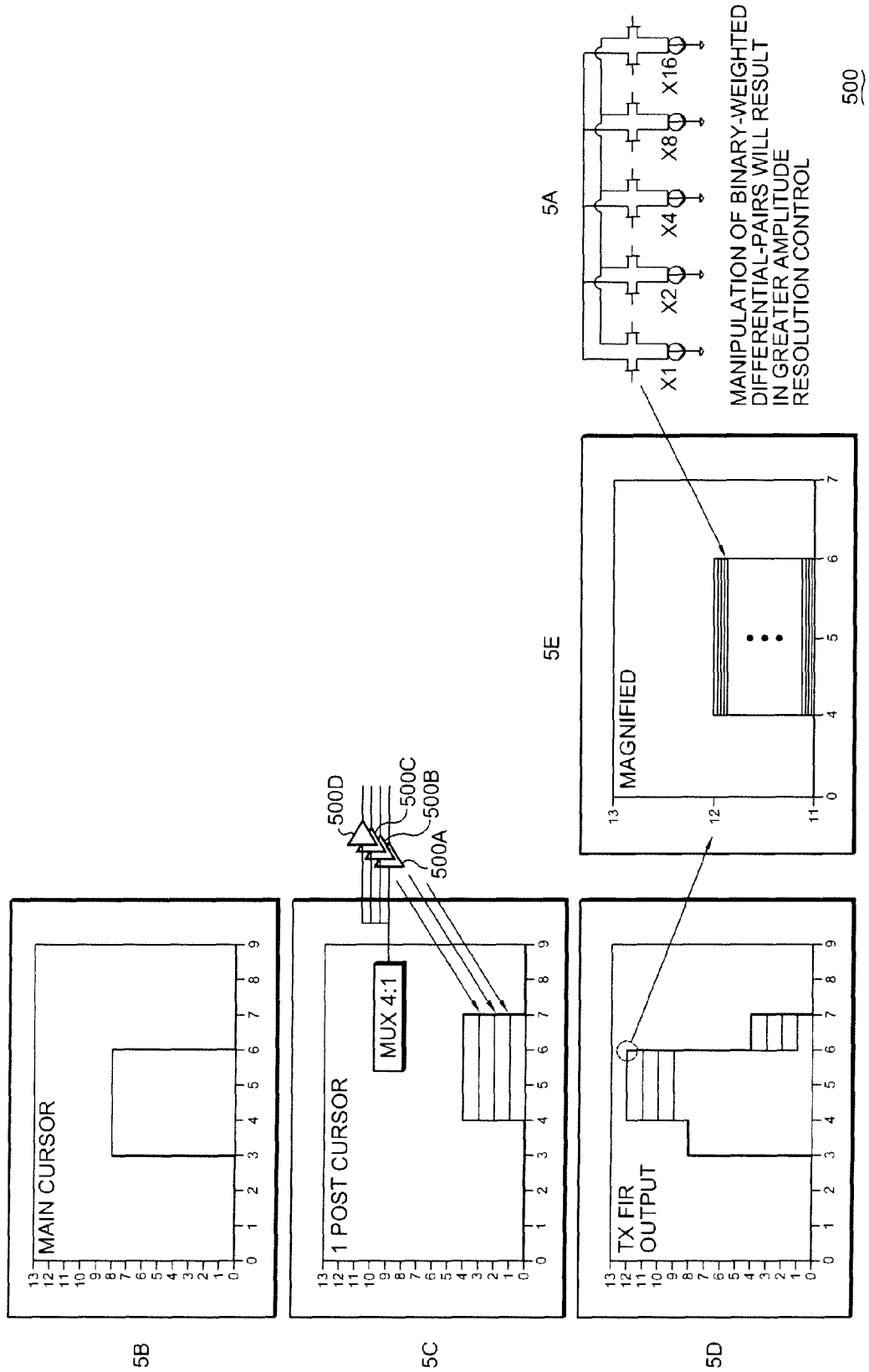
FIG. 5 illustrates the fine-tuning of FIR amplitude resolution of a TX FIR architecture according to an embodiment of the invention.

FIG. 5 illustrates the fine-tuning of FIR amplitude resolution of a TX FIR architecture according to an embodiment of the invention.

Referring to FIG. 5A, driver 500 of a TX FIR architecture comprises binary-weighted differential-pairs that are driven to various amplitude resolutions. Each binary-weighted differential-pair has a specific multiplier (1×, 2×, 4×, 8×, 16×) that can be summed to output a desired amplitude. Manipulation of the binary-weighted differential-pairs results in greater amplitude resolution control.

In a preferred mode of operation, manipulation of each pre- or post-cursor driver from an ON/OFF state adjusts the FIR amplitude resolution.

In one aspect of an embodiment of the invention, multiple drivers (500A-500D) in a group each can be made up of differential pairs that are binary weighted and can themselves be turned ON/OFF. This allows for greater control and further FIR amplitude resolution if necessary.

FIG. 5B illustrates the main cursor waveform. FIG. 5C illustrates one post-cursor waveform when a summed driven amplitude from each of drivers 500A to 500D. FIG. 5D illustrates the TX FIR output with the one post-cursor added to the main cursor. FIG. 5E illustrates a magnified view of the driven amplitude from one of the drivers, showing that the driven amplitude is made up of contributions from each of the binary-weighted differential-pairs of driver 500.

While the invention has been particularly shown and described with reference to a preferred embodiment thereof, it will be understood by those skilled in the art that various other changes in the form and details may be made without departing from the spirit and scope of the invention.

A presently preferred embodiment of the present invention and many of its improvements have been described with a degree of particularity. It should be understood that this description has been made by way of example, and that the invention is defined by the scope of the following claims.

We claim:

1. A transmitter finite impulse response (TX FIR) architecture, comprising:
   a multiplexer;
   a plurality of delay cells coupled to the multiplexer;
   a plurality of sign operators coupled to the plurality of delay cells;
   a plurality of serializer multiplexers, each coupled to a respective sign operator; and
   a plurality of driver groups, each coupled to a respective serializer multiplexer.

2. The TX FIR architecture of claim 1, wherein each driver group comprises at least one driver.

3. The TX FIR architecture of claim 1, wherein the multiplexer comprises a 20:4 multiplexer configured to output a four-bit data signal.

4. The TX FIR architecture of claim 1, wherein the multiplexer comprises a 16:4 multiplexer configured to output a four-bit data signal.

5. The TX FIR architecture of claim 1, wherein the plurality of delay cells are configured to output delayed versions of an input data signal from the multiplexer.

6. The TX FIR architecture of claim 1, wherein the multiplexer is configured to output a 4-bit data signal; and wherein the plurality of delay cells comprises 6 delay cells configured to output up to six-tap delayed versions of the 4-bit data signal from the multiplexer.

7. The TX FIR architecture of claim 1, wherein the multiplexer is configured to output a 4-bit data signal; and wherein the plurality of serializer multiplexers each comprises a 4:1 multiplexer configured to serialize the 4-bit data signal into a serial stream.

8. The TX FIR architecture of claim 1, further comprising a summing unit coupled to the plurality of driver groups.

9. The TX FIR architecture of claim 1, wherein each driver group comprises at least one driver; and wherein the at least one driver comprises a plurality of binary-weighted differential pairs.

10. The TX FIR architecture of claim 9, wherein the at least one driver comprises five binary-weighted differential pairs weighted at 1×, 2×, 4×, 8×, and 16×, respectively.

11. The TX FIR architecture of claim 9, wherein each binary-weighted differential pair is configured to be selectively turned on and off.

12. The TX FIR architecture of claim 1, wherein each driver group is configured to be selectively turned on and off.

13. The TX FIR architecture of claim 1, wherein each driver group comprises at least one driver; and wherein each driver is configured to be selectively turned on and off.

14. An electronic device comprising:
   a transmitter; and
   a finite impulse response equalizer coupled to the transmitter and comprising
      a multiplexer,
      a plurality of delay cells coupled to the multiplexer,
      a plurality of sign operators coupled to the plurality of delay cells,
      a plurality of serializer multiplexers, each coupled to a respective sign operator, and
      a plurality of driver groups, each coupled to a respective serializer multiplexer.

15. The electronic device of claim 14, wherein each driver group comprises at least one driver.

16. The electronic device of claim 14, wherein the plurality of delay cells are configured to output delayed versions of an input data signal from the multiplexer.

17. The electronic device of claim 14, wherein the multiplexer is configured to output a 4-bit data signal; and wherein the plurality of delay cells comprises 6 delay cells configured to output up to six-tap delayed versions of the 4-bit data signal from the multiplexer.

18. The electronic device of claim 14, wherein the multiplexer is configured to output a 4-bit data signal; and wherein the plurality of serializer multiplexers each comprises a 4:1 multiplexer configured to serialize the 4-bit data signal into a serial stream.

19. The electronic device of claim 14, wherein each driver group comprises at least one driver; and wherein the at least one driver comprises a plurality of binary-weighted differential pairs.

20. An electronic device comprising:
   a finite impulse response equalizer coupled to the transmitter and comprising
      a first multiplexer,
      a plurality of delay cells coupled to the first multiplexer, a plurality of sign operators coupled to the plurality of delay cells,
a plurality of second multiplexers, each coupled to a respective sign operator, and
a plurality of driver groups, each coupled to a respective serializer multiplexer.

21. The electronic device of claim 20, wherein each driver group comprises at least one driver.

22. The electronic device of claim 20, wherein the plurality of delay cells are configured to output delayed versions of an input data signal from the first multiplexer.

23. The electronic device of claim 20, wherein the first multiplexer is configured to output a 4-bit data signal; and wherein the plurality of delay cells comprises 6 delay cells configured to output up to six-tap delayed versions of the 4-bit data signal from the first multiplexer.

24. The electronic device of claim 20, wherein the first multiplexer is configured to output a 4-bit data signal; and wherein the plurality of second multiplexers each comprises a 4:1 multiplexer configured to serialize the 4-bit data signal into a serial stream.

25. The electronic device of claim 20, wherein each driver group comprises at least one driver; and wherein the at least one driver comprises a plurality of binary-weighted differential pairs.

* * * * *